United States Patent [19]
Murden et al.

[11] Patent Number: 5,861,831
[45] Date of Patent: Jan. 19, 1999

[54] INTERMEDIATE FREQUENCY (IF) SAMPLING CLOCK-TO-CLOCK AUTO-RANGING ANALOG-TO-DIGITAL CONVERTER (ADC) AND METHOD

[75] Inventors: Franklin M. Murden; Carl W. Moreland, both of Greensboro; Harvey J. Ray, Salem; Michael R. Elliott; Marvin J. Young, both of Greensboro, all of N.C.

[73] Assignee: Analog Devices, Inc., Norwood, Mass.

[21] Appl. No.: 772,358

[22] Filed: Dec. 23, 1996

[51] Int. Cl.$^6$ ........................................... H03M 1/62
[52] U.S. Cl. .................. 341/139; 341/132; 341/118; 341/142
[58] Field of Search .................. 341/139, 142, 341/118, 132

[56] References Cited

U.S. PATENT DOCUMENTS

| | | | |
|---|---|---|---|
| 4,851,842 | 7/1989 | Iwamatsu | 341/139 |
| 4,999,628 | 3/1991 | Kakubo et al. | 341/139 |
| 5,006,851 | 4/1991 | Kaneaki et al. | 341/155 |
| 5,068,658 | 11/1991 | Ohlsson et al. | 341/131 |
| 5,111,202 | 5/1992 | Rivera et al. | 341/139 |
| 5,194,865 | 3/1993 | Mason et al. | 341/132 |
| 5,365,233 | 11/1994 | Schaub | 341/139 |
| 5,389,927 | 2/1995 | Turney et al. | 341/139 |
| 5,546,081 | 8/1996 | Baumgarti | 341/139 |
| 5,630,221 | 5/1997 | Birleson | 455/249.1 |

FOREIGN PATENT DOCUMENTS

604746A  6/1994  European Pat. Off. .

Primary Examiner—Jeffrey A. Gaffin
Assistant Examiner—Jason H. Vick
Attorney, Agent, or Firm—Koppel & Jacobs

[57] ABSTRACT

A clock-to-clock auto-ranging ADC operates directly on an analog signal in the IF band or higher to track its gain range on a clock-to-clock basis and produce a digital signal that maintains high resolution of the analog signal without clipping or loss of signal sensitivity. This is accomplished by sampling an analog signal of sufficiently high frequency that a peak detector can accurately determine the maximum signal level over at least one-half a signal period and then reset the signal gain going into the ADC prior to the beginning of the next sampling period. This insures that the analog signal will always be within the range of the ADC. In accordance with the well known principles of sampling theory, the sampled analog signal is aliased into the frequency region between DC and one half the sampling frequency.

29 Claims, 9 Drawing Sheets

| $\Delta V$ | $\Delta V_{upper}$ | LATCH | RSSI | Atten. | Path Gain |
|---|---|---|---|---|---|
| ⩾250mv | ⩾250mv | 111 | 101 | −30dB | −12dB |
| ⩾125mv | ⩾125mv | 011 | 100 | −24dB | −6dB |
| ⩾62.5mv | ⩾62.5mv | 001 | 011 | −18dB | 0dB |

FIG.8a

| $\Delta V$ | $\Delta V_{lower}$ | LATCH | RSSI | Atten. | Path Gain |
|---|---|---|---|---|---|
| ⩾31.25mv | ⩾250mv | 11 | 010 | −12dB | +6dB |
| ⩾15.625mv | ⩾125mv | 01 | 001 | −6dB | +12dB |
| ⩾7.8mv | ⩾62.5mv | 00 | 000 | 0dB | +18dB |

INTERMEDIATE FREQUENCY (IF) SAMPLING CLOCK-TO-CLOCK AUTO-RANGING ANALOG-TO-DIGITAL CONVERTER (ADC) AND METHOD

BACKGROUND OF THE INVENTION

1. Field of the Invention

This invention relates to ADCs and more specifically to a clock-to-clock auto-ranging ADC that operates directly on the IF band.

2. Description of the Related Art

Known ADCs are used to convert a baseband analog signal (0–500 KHz) into an equivalent digital signal by sampling the baseband signal at at least twice the signal frequency to satisfy the Nyquist criterion and then quantizing the sampled values with a fixed number of bits. The baseband signal may be oversampled 16 to 128 times to achieve a processing gain and to ease the tolerances on filters and amplifiers that are used in conjunction with the ADC.

Known communications systems modulate different high frequency sinusoidal carrier signals with respective baseband signals, broadcast them over the communications channel, and demodulate them at the receiver. This reduces the required size of the transmitter and receiver antennas and allows simultaneous transmission of multiple baseband signals. At the transmitter, the baseband signals are modulated up to the different IF bands, upconverted to the different RF channels, and transmitted over the channel. At the receiver, multiple mixdown stages are used in conjunction with narrow band filters to downconvert the RF signal to, for example, 71 MHz, 10.7 MHz and then to baseband and to select a particular baseband signal. The baseband signal is then input to the ADC, which produces the equivalent digital signal.

As a result of the transmission medium, the received signal level may vary over a relatively wide amplitude range. For example, the signal may vary by 30 dB within its 90 dB range during a data burst. If this signal were input directly to a fixed-range ADC, as the signal moved over the 90 dB range the ADC would at times saturate and clip the signal and at other times only coarsely resolve the signal. Thus, some known ADCs employ tracking circuitry that gains/attenuates the signal prior to digitizing such that the dynamic range of the signal approximately matches that of the fixed-range ADC. However, the tracking circuitry exhibits a time delay such that the signal may clip or be coarsely resolved for a period of time before the gain/attenuation can be adjusted. Furthermore, after the gain/attenuation is adjusted the signal must settle for some period of time. This will introduce distortion and a loss of signal sensitivity.

A well known approach is to pass the baseband signal through multiple gain paths in which each gain path has a different gain/attenuation buffer and its own fixed-range "flash" ADC. The DSP looks at the digital signal coming out of the highest gain channel. If the digital signal is saturated, the DSP steps down to the next highest gain channel and so forth until it identifies an unsaturated signal. This causes a time delay of several clock cycles before the proper gain/attenuation level is attained, during which the digital signal is saturated and information may be lost. Furthermore, the signals gain paths cannot be changed during the burst because the equalization would be severely compromised due to phase and gain differences between gain paths. As a result, the receiver is very hardware intensive.

Iwamatsu, U.S. Pat. No. 4,851,842, discloses an ADC that detects the level of the baseband input signal and uses the detected level to adjust the gain of its variable gain amplifier. As shown in FIG. 2 and described in col. 3, lines 22–27, when the detected level crosses one of the preset levels there is a delay of several cycles of the baseband input signal before the gain of the amplifier is adjusted and the signal has settled. Iwamatsu calls this delay the "insensitive region," in which the signal could saturate the ADC thereby clipping the signal or underrange the ADC thereby providing only coarse resolution.

As shown, the insensitive region includes approximately eight baseband cycles. Since the ADC's sampling rate must satisfy the Nyquist criterion, the insensitive region corresponds to a minimum of sixteen cycles of the digital output signal, and potentially many more if the ADC oversamples the baseband signal. Thus, every time the gain level is adjusted, there is a lag of at least sixteen clock cycles in the digital signal before the appropriate gain level is applied and the analog signal settles, during which the digital signal can either saturate or only coarsely resolve the baseband analog signal.

Another drawback of Iwamatsu is that the level detection circuit adjusts the resistance value of the feedback circuitry around the amplifier to set its gain. As a result, the bandwidth and phase of the resulting digital signal may be a function of the selected gain level. Thus, as before, equalization may be compromised.

SUMMARY OF THE INVENTION

In view of the above problems, the present invention provides an ADC that operates directly on a modulated or unmodulated carrier signal, hereafter referred to as the analog signal, in the IF band or higher to adjust its range on a clock-to-clock basis to maintain high resolution of the analog signal without clipping or loss of signal sensitivity.

This is accomplished by sampling an analog signal of sufficiently high frequency, IF band or higher, such that a peak detector can accurately determine the maximum signal level over at least one-half a signal period and then reset the signal gain going into the ADC prior to the beginning of the next sampling period. This insures that the analog signal will always be within the range of the ADC. In accordance with the well known principles of sampling theory, the sampled analog signal is aliased into the frequency region between DC and one half the sampling frequency. In the case of an unmodulated signal, the aliased data is used, for example, as a single frequency test signal in a digital spectrum analyzer. With a phase or frequency modulated signal, the aliased data is then passed to a DSP where the information signal component can be extracted.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 8a and 8b are tables illustrating the operation of the upper and lower pea detectors, respectively;

DETAILED DESCRIPTION OF THE INVENTION

The present invention provides an auto-ranging ADC that samples an analog signal of sufficiently high frequency, IF band or higher, such that a peak detector can accurately determine the maximum signal level over at least one-half a signal period and then reset the signal gain going into the ADC prior to the beginning of the next sampling period. This insures that the analog signal will always be within the range of the ADC. In accordance with the well known principles of sampling theory, the sampled analog signal is aliased into the frequency region between DC and one half the sampling frequency.

The auto-ranging ADC can be used in systems such as cellular telephone networks, communications receivers, electro-optics and medical imaging, in which a baseband signal modulates a higher frequency carrier such that the analog signal occupies a relatively narrow band around the carrier frequency. In this case the sampling frequency must be high enough to satisfy the Nyquist criteria relative to the baseband signal and low enough to detect at least one-half a signal period. Alternately, the auto-ranging ADC can be used in a digital spectrum analyzers, in which the high frequency carrier is not modulated but is rather aliased down to provide a test tone, for example. Although the ADC is described herein as operating directly on signals in the IF band (70–250 MHz), the principles embodied therein are equally applicable to other frequency bands such as RF that are above baseband. Although the described ADC is implemented with a complementary bipolar process to provide the necessary speed to operate directly on the IF band, the same architecture may be used in other processes such as BiCMOS.

Figure 1:
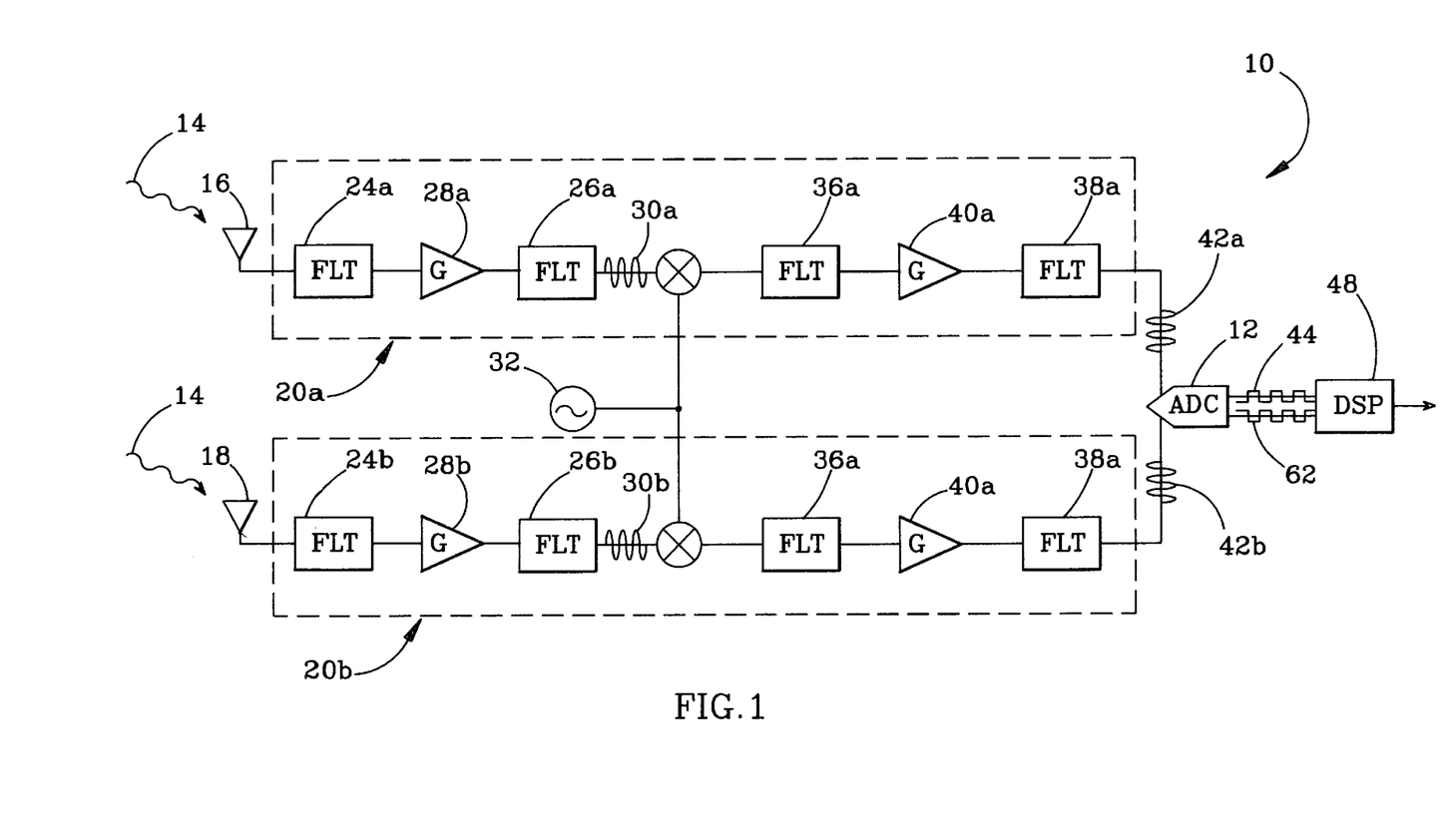
FIG. 1 is a block diagram of a dual-channel communications system that includes a dual-channel IF sampling clock-to-clock auto-ranging ADC of the present invention.

FIG. 1 illustrates a cellular base station 10 that includes a dual-channel IF sampling clock-to-clock auto-ranging ADC 12. Due to the very short wavelengths of the transmitted RF signal 14, cellular base stations preferably use a main antenna 16 and a diversity antenna 18 that are separated by some minimum distance to receive transmitted RF signals. The two signals are processed in parallel and the strongest signal is selected downstream. The main channel 20a uses a pair of filters 24a and 26a and a fixed gain stage 28a to select a particular RF channel 30a. A local oscillator 32 downconverts the selected RF channel to an IF frequency band. A pair of filters 36a and 38a and a fixed gain stage 40a select a particular analog signal 42a, which is modulated with a baseband information signal. The diversity channel 20b selects an analog signal 42b in the same manner as the main channel 20a with components 24b, 26b, 28b, 36b, 38b and 40b. At least one local oscillator is eliminated from the system by operating directly on the IF band, which lowers the cost of the system.

Figure 2:
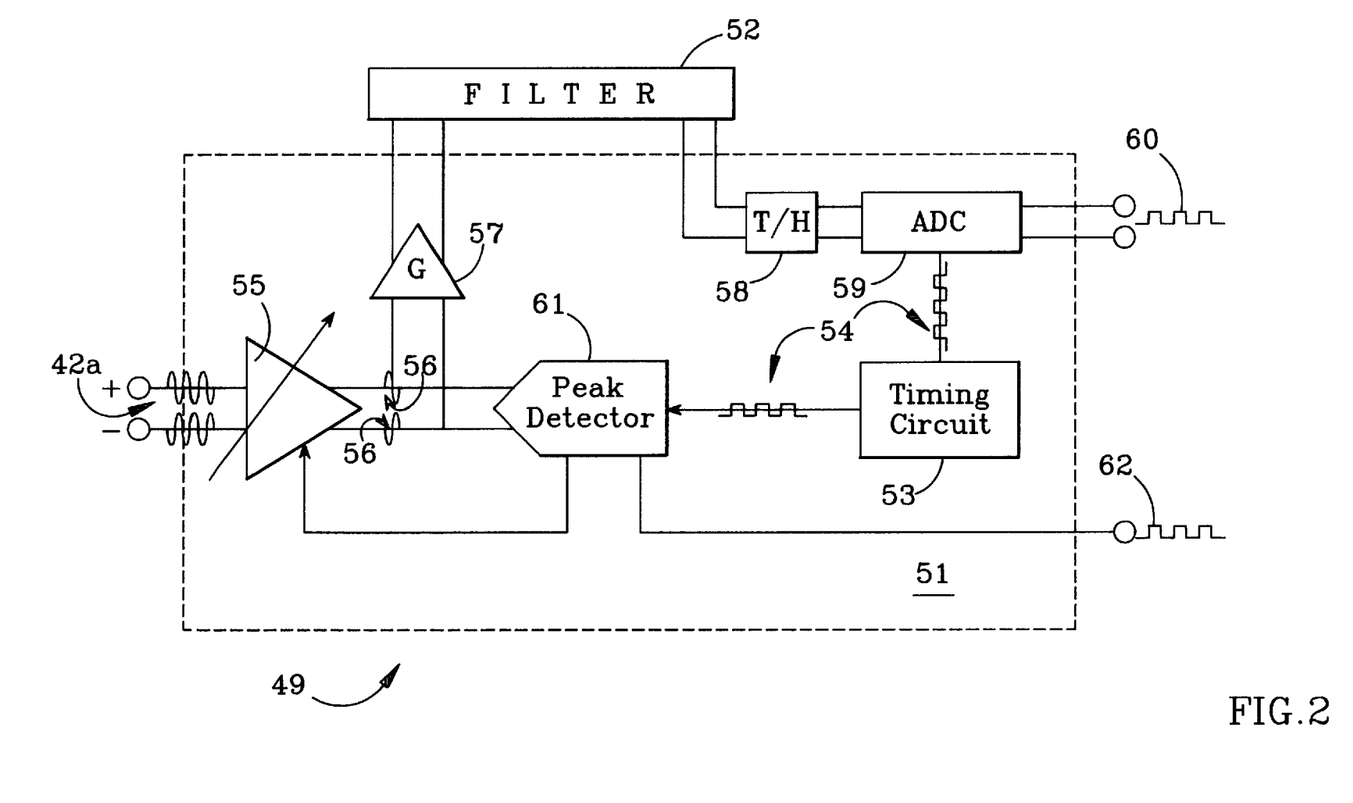
FIG. 2 is a block diagram of a single-channel IF sampling clock-to-clock auto-ranging ADC.
Figure 3:
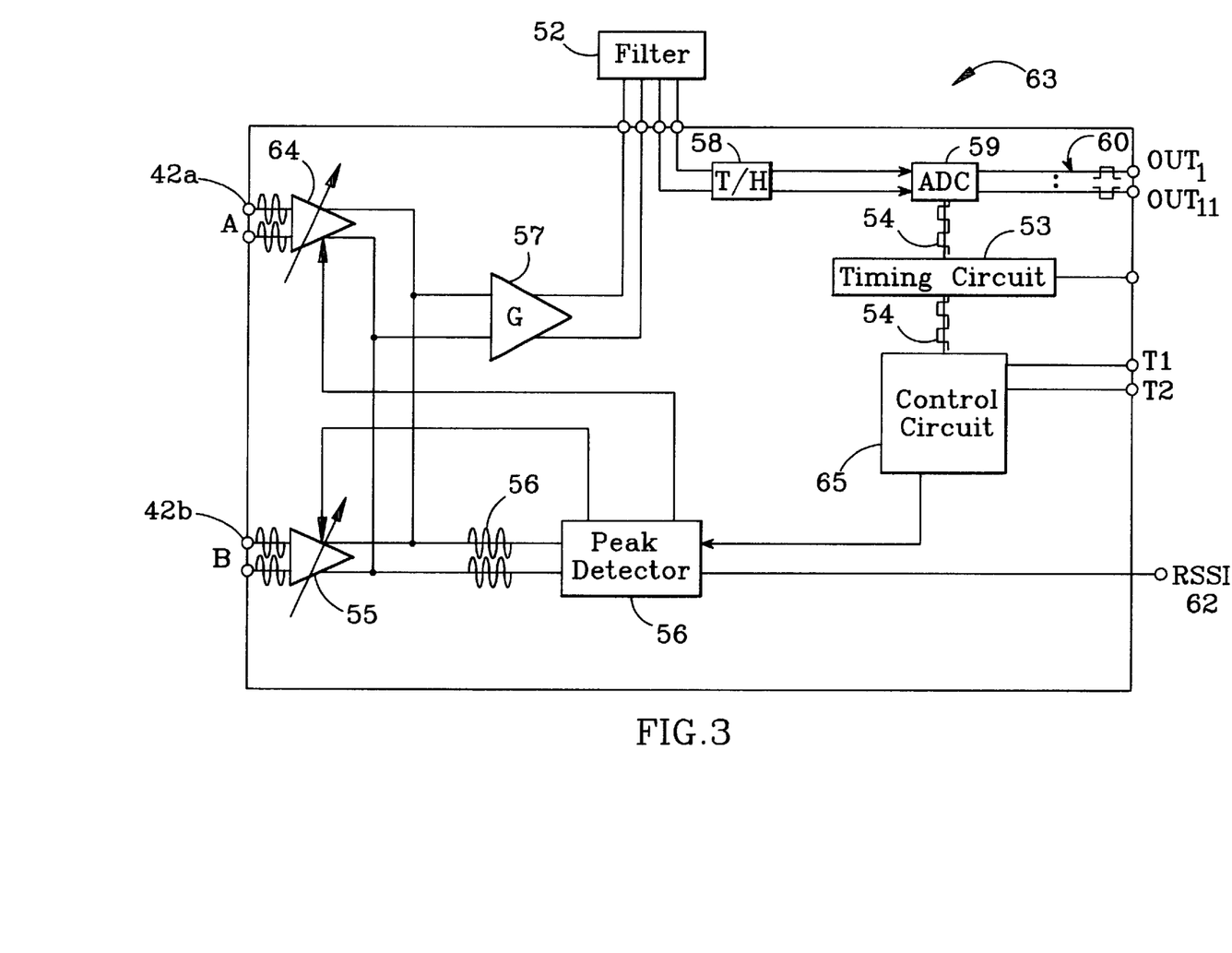
FIG. 3 is a schematic block diagram of the dual-channel IF sampling clock-to-clock auto-ranging ADC shown in FIG. 1.

The ADC 12 can be implemented with a pair of single-channel ADCs (shown in detail in FIG. 2) or a dual-channel auto-ranging ADC (shown in detail in FIG. 3). The dual-channel ADC operates on the main and diversity analog signals 42a and 42b on alternate clock cycles to produce a digital signal 44 that is equivalent to the multiplexed baseband information signals and a Relative Signal Strength Indicator (RSSI) 62 that tracks the movement of the signals' dynamic ranges. The ADC's clock frequency satisfies the Nyquist criterion for the baseband information signal but is at most equal to the frequency of the main and diversity analog signals 42a and 42b. At each clock cycle, the ADC 12 detects a peak level over at least one-half cycle of the selected analog signal, adjusts its attenuation level, and digitizes the attenuated signal so that it is aliased into the frequency range between DC and one half the ADC's sampling frequency. The clock-to-clock auto-ranging capability avoids both clipping and coarsely resolving the baseband signal component. In addition, only one ADC is required to process both the main and diversity channels.

A DSP 48 combines the digital signal 44 with the RSSI 62, extracts the baseband signal components, equalizes the main and diversity channels, selects the strongest signal and processes it for rebroadcast to the individual cellular users. Because the ADC 12 maintains the phase of the signal regardless of the attenuation level, the DSP 48 is programmed to implement only a single equalizer.

As shown in FIG. 2, a single-channel IF sampling clock-to-clock auto-ranging ADC 49 for directly converting an analog signal 42a, modulated or unmodulated, at an IF frequency or higher into a digital signal 44 is preferably implemented as an integrated circuit (IC) chip 51 with an external filter 52 whose characteristics are selected based upon the particular system architecture. The filter 52, either low pass or band pass, depending on the system architecture limits the noise and controls the spectral content of the analog signal entering a fixed-range ADC 59. The bandwidth of the filter is designed to allow sufficient settling after peak detection.

A timing circuit 53 generates a clock signal 54 at a sampling frequency that is less than the analog signal frequency but satisfies the Nyquist criteria for the modulating signal, if applicable. The analog signal 42a is applied to the input of a digitally controlled programmable attenuator 55, which attenuates the signal and outputs an attenuated signal 56. A fixed gain stage 57, suitably 18 dB, amplifies the attenuated signal 56 to set the desired overall gain/attenuation of the signal path. The signal is then passed through the external filter 52 to a track-and-hold circuit 58 that tracks the filtered analog signal over the remaining portion of the current clock cycle, and then holds the value at the onset of the next half-cycle. By positioning the track-and-hold circuit at the input of the ADC 59, the dynamic range performance of the circuit can be reduced approximately 30 dB, which allows it to operate at significantly lower power. The fixed-range ADC 59 converts the successive values output by the track-and-hold circuit 58 into a sequence of digital codewords 60 at the sampling frequency. The number of bits of the ADC and the number of gain steps in the attenuators are preferably chosen to optimize a particular application.

At the onset of each successive clock cycle, an RSSI peak detector 61 sets the programmable attenuator 55 at a reference attenuation level, for example 0 dB, detects a peak value over at least one-half a cycle of the attenuated signal 56, and computes a new attenuation level based upon the peak value. The peak detector 61 adjusts the ADC's attenuation level in the same clock cycle so that the attenuated signal 56 is matched to a desired sub-range of the full-scale input range of the fixed-range ADC 59 on a clock-to-clock basis and outputs an RSSI codeword 62 that indicates the selected attenuation level. This eliminates the time delay found in known auto-ranging ADCs, and thus provides high resolution of the baseband information signal without saturating the ADC.

The digitally controlled programmable attenuator 55 (shown in detail in FIGS. 9 and 10) provides a plurality of attenuation levels that are spaced apart by a fixed step size. In the preferred embodiment, there are six levels ranging from 0 dB to −30 dB and spaced apart by 6 dB. A 6 dB increment is convenient because it corresponds to a doubling of the signal amplitude, i.e. 1 bit. Thus, the digital signal 60 can be rescaled by the DSP 48 shown in FIG. 1 using bit-shifting in accordance with the value of the RSSI 62.

The RSSI peak detector 61 (shown in detail in FIGS. 6 and 7) detects the peak level over at least one half cycle of the attenuated signal 56 during a leading portion of the current clock cycle. The peak detector has a plurality of peak levels that are associated with the respective attenuation levels, and spaced apart by, for example, 6 dB step sizes. In the preferred embodiment there are five levels with the maximum and minimum levels corresponding to one-quarter and one-sixtyfourth of the full-scale input range of the ADC 59, respectively. The peak detector is preferably implemented with 1-bit of digital hysteresis. The five levels correspond to five bits of information such that the effective dynamic range of the auto-ranging ADC 49 is 16 bits as compared to the 11 bit dynamic range of the fixed-range ADC 59.

The peak detector 61 computes the RSSI 62 for the detected peak level, writes it to the RSSI output, and selects the associated attenuation level. The attenuation levels are preferably set such that when the analog signal 42a is less than quarter-scale, the attenuated signal 56 input to ADC 59 is constrained to lie between one-quarter and one-half of its full-scale input range. When the modulated carrier signal is greater than quarter-scale, it is attenuated so that it lies between one-quarter and full-scale. This provides an additional one bit safety buffer to avoid saturating the ADC. Furthermore, when the analog signal is less than one-sixtyfourth full scale, the ADC signal linearly follows the analog signal.

Since the auto-ranging ADC 12 is designed to sample the analog signal at below the Nyquist sampling rate, some of the advantages of undersampling can be exploited. First, the sampled analog signal is aliased into the frequency region between DC and one half the sampling frequency. Thus, analog signals in the IF band or higher can be directly converted to lower frequencies, which eliminates one or more mixdown stages. For example, a 65 MHz analog signal sampled at 20 MHz is aliased down to a 5 MHz signal. If the analog signal is modulated about a narrow band, e.g. 200 KHz, the sampling frequency must satisfy the Nyquist criterion with respect to that bandwidth. In this case, the 5 MHz signal is passed to the DSP to extract information signal at baseband.

Another property relates to the placement of the analog signal in the Nyquist zones. For example, if the analog signal range is from DC to one-half the sampling frequency ($F_s$), as it would be in known ADCs, then the ADC 59 must perform to the specification required. However, if the signal is placed in a higher Nyquist zone, for example the third ($F_s$ to $3F_s/2$), the ADC 59 is no longer required to meet the harmonic performance required by the system specification since all signals will be aliased to within $F_s/2$.

A third property that can be exploited is to alias the ADC harmonics out of band. Once the analog signal is sampled by the track-and-hold circuit 66, the frequency of the input signal will be converted to a signal in the first Nyquist zone. Any harmonics of the ADC will become relative to the frequency of the signal as it appears in the first Nyquist zone. Therefore by carefully selecting where the IF band falls within the first Nyquist zone, the second and third harmonics can be aliased out of band if needed. For example, by carefully selecting the sampling frequency and analog signal frequency, the second and third harmonics can be placed out-of-band. This allows decimation and FIR filtering to remove only the signals of interest while filtering the remaining spurious performance of the ADC.

As shown in FIG. 3, a dual-channel ADC 63 is implemented by connecting a second digitally controlled programmable attenuator 64 in parallel with the first attenuator 55. A control circuit 65 causes the peak detector 61 to select one of the two channels for dedicated processing or alternates back-and-forth between the two. A user selects the desired mode by applying a binary code to inputs T1 and T2; 00 for alternating A/B, 01 for A, and 10 for B, for example. The dual-channel ADC 63 can be used to process main and diversity signals such as shown in FIG. 1, two independent signals or one signal separated by a gain block. As a result, the dual-channel ADC can process two signals with only one fixed-ADC.

Figures 4A, 4B:
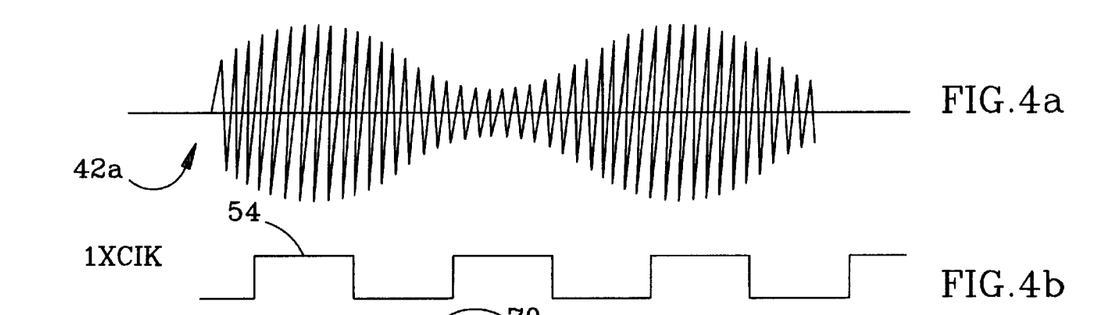
FIGS. 4a through 4i are timing diagrams for ADC shown in FIG. 3.
Figure 4C:
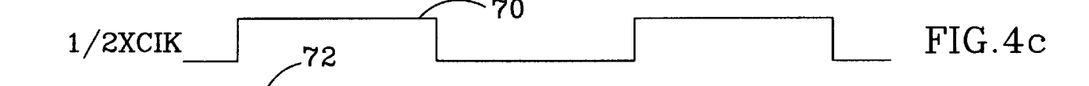
Figure 4D:
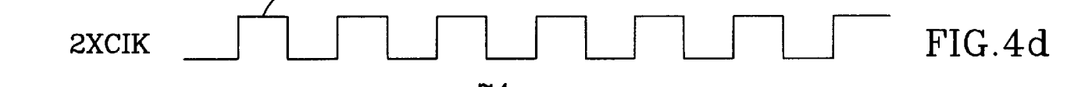
Figure 4E:
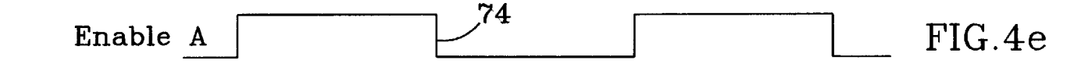
Figure 4F:
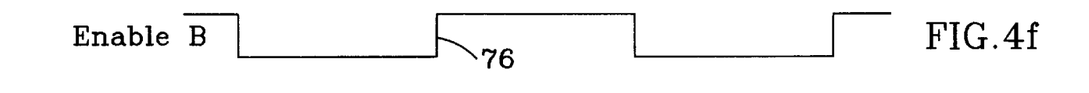

FIGS. 4a through 4i illustrate a timing sequence for the dual-channel clock-to-clock auto-ranging ADC 63 detailed in FIGS. 1, 2 and 3. As shown in FIG. 4a, the strength of the main analog signal 42a may vary over a 90 dB dynamic range. The analog signal is typically phase or frequency modulated so that it occupies a narrow band, e.g. 200 kHz, around its carrier frequency, 70–250 MHz. FIGS. 4b, 4c and 4d show the clock signal 54 and ½× and 2× clock signals 70 and 72, respectively. (The ½× and 2× clock signals may be replaced with fixed delays) The ½× clock signal 70 controls enable A 74 and enable B 76 signals shown in FIGS. 4e and 4f, respectively, which turn programmable attenuators 55 and 64 shown in FIG. 3 on and off on alternating 1× clock cycles.

Figure 4G:
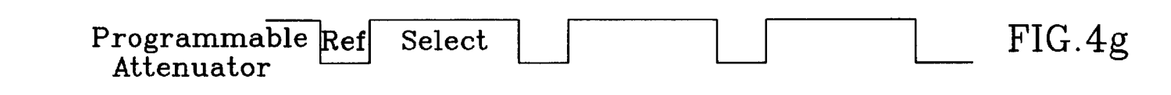
Figure 4H:
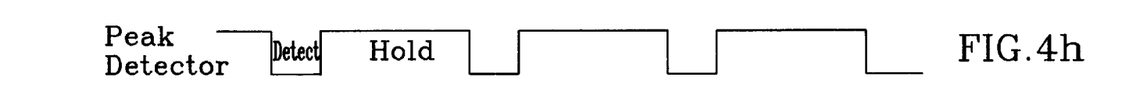

The 2× clock signal 72 controls the operation of the enabled programmable attenuator, 55 or 64, and the peak detector 61. At the onset of every other 2× clock cycle, which corresponds to the onset of successive 1× clock cycles, the enabled programmable attenuator selects its reference attenuation level and the peak detector is reset and enters detection mode as shown in FIGS. 4g and 4h. At the end of the first half-cycle of the 2× clock signal 72 (¼-cycle of the 1× signal), the peak detector holds the detected peak level and updates the RSSI in accordance with the detected peak level, and the programmable attenuator selects the associated attenuation level so that the attenuated analog signal settles by the onset of the next 2× clock cycle.

Figure 4I:
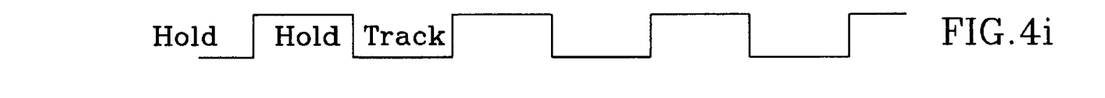

As shown in FIG. 4i, the track-and-hold circuit 58 shown in FIG. 2 tracks the amplitude of the attenuated signal over the second half-cycle of the 1× clock signal 54. At the onset of the next cycle of the 1× clock signal 54, the ADC 59 converts the amplitude to a 11-bit codeword and outputs it as digital signal 60. At the same time, the programmable attenuator and peak detector initiate detection of the next peak level. As a result, the attenuation level is adjusted and the signal allowed to settle on a clock-to-clock basis.

Figure 5:
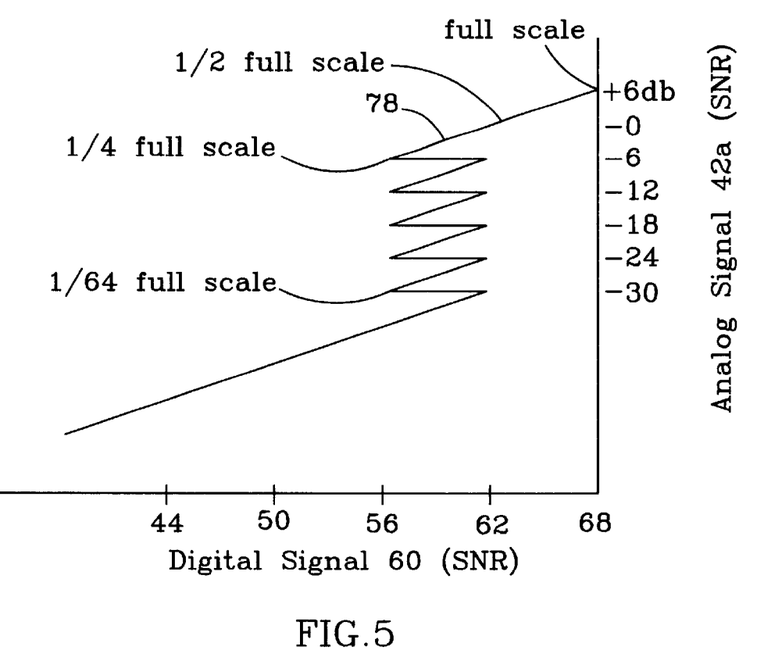
FIG. 5 is a plot of the SNR versus input signal level for the ADCs shown in FIGS. 2 and 3.

FIG. 5 is a plot 78 of the SNR of the digital signal 60 versus the amplitude of the analog signal 42a or 42b. When the signal's amplitude is less than quarter-scale, i.e. below −12 dB, it is ideally mapped between ¼ and ½ of the full scale input range of the fixed-range ADC 59 shown in FIGS. 2 and 3. As a result, the ADC 59 utilizes between 9 and 10 bits, which at 6 dB per bit, corresponds to an SNR between 56 and 62 dB. When the signal's amplitude is between quarter-scale and full-scale, it is mapped to between ¼ and full scale of the ADC. As a result, the ADC 59 utilizes between 9 and 11 bits, which corresponds to an SNR between 56 and 68 dB.

Figure 6:
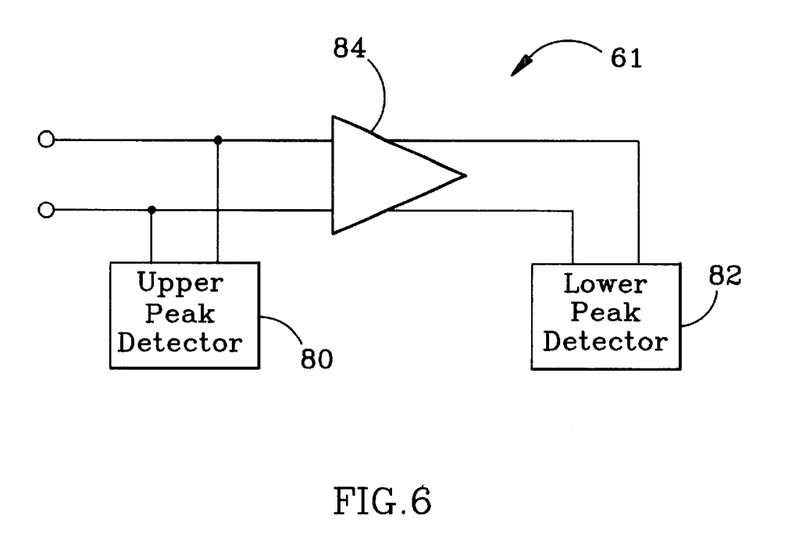
FIG. 6 is a block diagram of a preferred embodiment of the peak detector shown in FIGS. 2 and 3.

As shown in FIG. 6, the preferred architecture for the peak detector 61 shown in FIGS. 2 and 3 includes a plurality of peak detection stages for detecting peak levels in respective sub-ranges of the ADC's full-scale input range. In particular, upper and lower peak detection stages 80 and 82 detect peak levels in the upper and lower portions of the ADC's full-scale input range, respectively. Six dB of digital hysteresis is preferably used to eliminate level uncertainty at the threshold points in both the upper and lower peak detection stages. The multi-stage architecture increases bandwidth and maintains amplitude resolution while sacrificing phase information.

The peak detection stages are designed and biased in conjunction with the programmable attenuator's reference attenuation level such that the upper peak detection stage 80 detects when the signal exceeds 1/16, 1/8 and 1/4 the full-scale input range of the fixed ADC and the lower peak detection stage 82 detects when the signal exceeds 1/32 and 1/64 the full-scale input range. If the digital hysteresis were eliminated, the lower peak detector 82 could detect an additional peak level at 1/128 of the full-scale input range. Except for dropping the last peak level (1/128) to implement the digital hysteresis, the upper and lower peak detection stages are preferably identical.

When identical peak detection stages are used, they are separated by a fixed gain stage 84, 18 dB in the described embodiment, that amplifies the IF band so that smaller peak amplitudes are detected by the lower peak detector 82. This minimizes the effects of offset errors in the lower peak detector. The fixed gain stage must have a wider bandwidth than the individual stages such that any improvements in bandwidth realized by the multi-stage architecture can be seen. Furthermore, if two or more gain stages are used they must be tightly matched to preserve amplitude resolution. The fixed gain stage 84 could be eliminated from the peak detector 56 by changing the biasing of the lower peak detector 82.

By splitting the peak detector 61 into two component detectors, the capacitance seen at the last tap of each detection stage is reduced, which increases their effective bandwidth by lowering the RC time constant. The number of taps and, hence capacitance, is further reduced by using a geometric resolution of the full-scale range rather than a uniform resolution. In the described two-stage embodiment, the normalized resistance of each stage is 4R and includes 3 taps. A comparable "flash" ADC would have a total resistance of 32R, or 8 times that required by the preferred peak detector and 31 taps, or approximately 10 times the preferred architecture. Thus, in this particular case, the multi-stage peak detector realizes at least one order of magnitude improvement in bandwidth.

Figure 7:
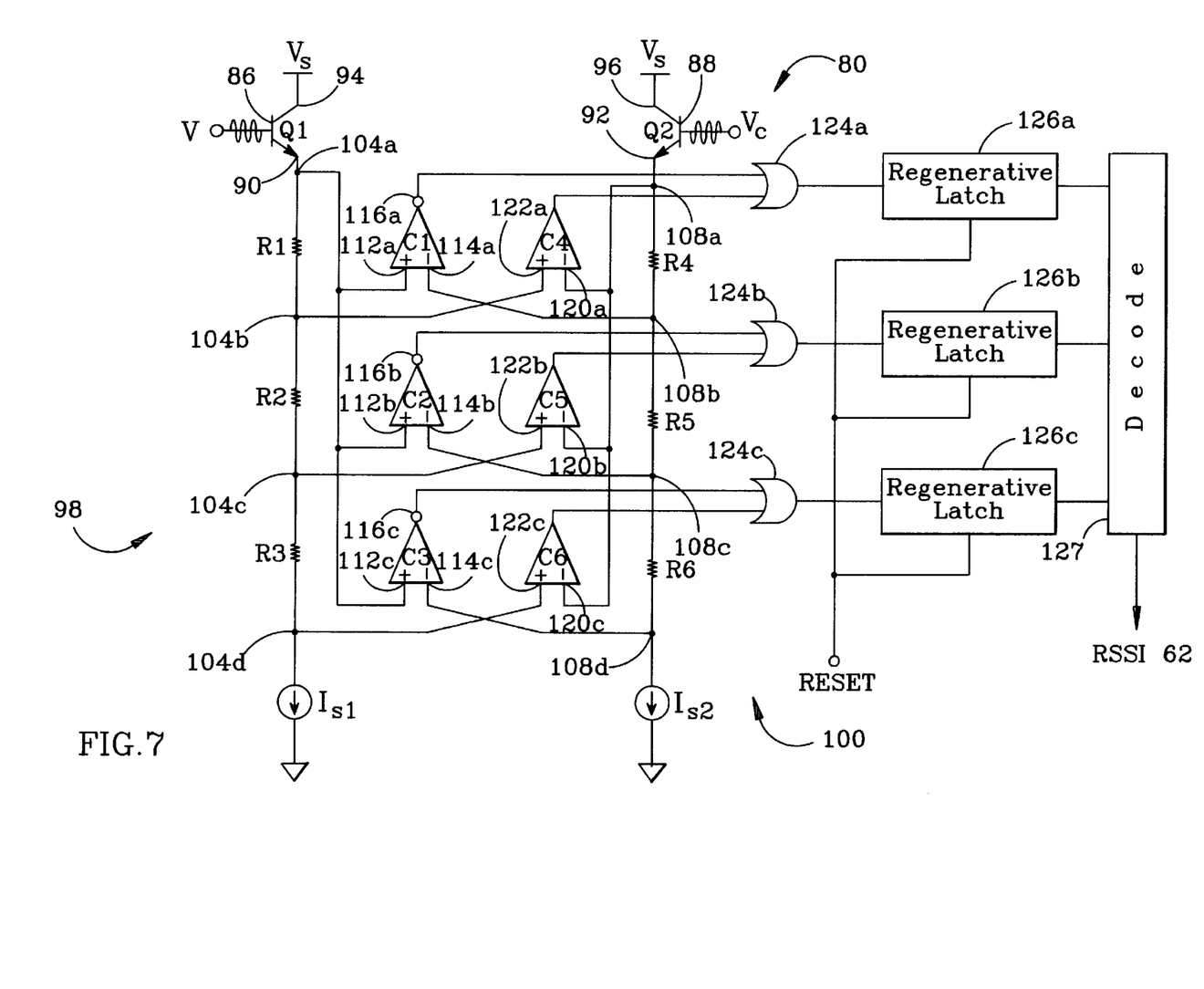
FIG. 7 is a schematic diagram of a 3-tap peak detector for the upper peak detector shown in FIG. 6.

As shown in FIG. 7, the preferred embodiment of the upper peak detection stage 80 responds to the analog signal to detect both positive and negative amplitudes and output the highest peak magnitude crossed during at least one half cycle of the signal. The attenuated signal 58 is represented by complementary voltage signals V and $V_c$ that are applied differentially to the bases 86 and 88 of npn transistors Q1 and Q2, respectively, such that the voltage signals at their emitters 90 and 92 follow the voltage signals V and $V_c$. Their collectors 94 and 96 are connected to the supply voltage $V_s$, suitably 5V.

Multi-tap resistive ladders 98 and 100 are connected between Q1's emitter 90 and a current source $I_{s1}$ and Q2's emitter 92 and a current source $I_{s2}$, respectively, to detect the negative and positive peak amplitudes. In the described embodiment, the resistive ladder 98 includes three series connected resistors R1, R2 and R3 with a reference tap 104a at the connection between the ladder and Q1's emitter 90. Taps 104b, 104c and 104d are provided at the series connections between successive resistors to detect the three peak levels in the upper portion of the full-scale input range for negative signal amplitudes. Resistive ladder 100 includes series connected resistors R4, R5 and R6 that provide taps 108a, 108b, 108c and 108d to detect the three peak levels in the upper portion of the full-scale input range for positive signal amplitudes. To set the step-size between successive peak levels at −6 dB, the resistance of each successive resistor is selected so that the total resistance of the ladder doubles at each tap. For example, if resistors R1, R2 and R3 (R4, R5 and R6) have resistances R, R and 2R, the threshold voltage doubles at each successive tap.

A first set of three comparators C1, C2 and C3 have respective non-inverting inputs 112a, 112b and 112c that are connected to reference tap 104a such that the voltage level at the non-inverting inputs tracks the voltage signal V. The comparators' inverting inputs 114a, 114b and 114c are connected to taps 108b, 108c and 108d, respectively, such that the voltage level at the inverting inputs tracks the complementary voltage signal $V_c$ offset by the threshold voltages across resistors R4, R5 and R6, respectively. Inverters 116a, 116b and 116c are connected to the outputs of the comparators C1, C2 and C3, respectively.

A second set of three comparators C4, C5 and C6 have respective inverting inputs 120a, 120b and 120c that are connected to reference tap 108a such that the voltage level at the inverting inputs tracks the complementary voltage signal $V_c$. The comparators' non-inverting inputs 122a, 122b and 122c are connected to taps 104b, 104c and 104d, respectively, such that the voltage level at the non-inverting inputs tracks the voltage signal V offset by the threshold voltages across resistors R1, R2 and R3, respectively.

When the differentially driven transistors Q1 and Q2 are at balance, i.e. V−$V_c$=0V, the voltage levels at the inverting inputs of comparators C1, C2 and C3 are lower than the voltage level at their non-inverting inputs by an amount equal to the threshold voltages across resistors R4, R5 and R6. Therefore, the polarity of the differential input voltage to comparators C1, C2 and C3 is positive, which holds them in a high state and the inverted outputs in a low state. Similarly, the voltage levels at the inverting inputs of comparators C4, C5 and C6 are higher than the voltage level at their non-inverting inputs by an amount equal to the threshold voltages across resistors R1, R2 and R3, which holds their outputs in a low state. Thus, at balance, the detected peak level has a 5-bit digital representation of 00000.

As the magnitude of the differential voltage V−$V_c$ increases and crosses the different threshold voltages, the polarity of the differential input voltage to the individual comparators switches, which causes that comparator to switch state. For example, as the input voltage V starts to go negative, and hence the voltage $V_c$ goes positive, the difference between the voltage signals at the inverting and non-inverting inputs of comparators C1, C2 and C3 is reduced. When the magnitude of the differential voltage crosses the threshold voltage across resistor R4, the polarity of the differential input voltage to comparator C1 becomes negative causing the comparator to switch states so that the inverted output goes high indicating the lowest peak level in the upper portion. In the described embodiment, the value of R and the bias current are selected so that the threshold voltage corresponds to 1/16 the full-scale input range. Similarly, when the magnitude of the differential voltage crosses the threshold voltages across resistors R5 and R6 corresponding to 1/8 and 1/4 full-scale, respectively, comparators C2 and C3 switch states.

The outputs and inverted outputs of comparators C1 and C4, C2 and C5, and C3 and C6, are respectively applied to two-input OR gates 124a, 124b, and 124c. The OR gates combine the detected positive and negative peak levels to indicate the peak magnitude of the analog signal. The outputs of the OR gates 124a, 124b, and 124c are applied to regenerative latches 126a, 126b, and 126c, respectively. A decoder 127 reads the outputs of the latches and generates the RSSI codeword 62 that sets the gain of the programmable attenuator. A reset signal clears the latches at the onset of each successive clock cycle as shown in FIG. 4h. Thereafter, when one of the comparators is tripped in the first half-cycle of the 2× clock signal, the corresponding latch switches states and remains in that state until it is reset by the next clock cycle. For example, if the signal is greater than quarter-scale, all of the latches in the upper peak detector, as well as those in the lower peak detector, will be set in a high state thereby indicating the maximum peak value 11111. Conversely, if the signal is between 1/16 and 1/32 full-scale, both of the latches in the lower peak detector will be set in a high state but all of the latches in the upper peak detector will remain in the low state (00011).

In the preferred embodiment, the lower peak detector 82 is the same as the upper peak detector 80 except that comparators C1 and C4, OR gate 124a, and latch 126a are removed. This is done so that the threshold voltage across resistors R1 and R4 can be used to provide the 1-bit of digital hysteresis for the smallest detected peak level, i.e. 1/128 of full-scale. The higher peak levels use the threshold voltage from the previous peak level to provide the digital hysteresis. In general, once a comparator is switched high, 1 bit of hysteresis is applied to its input so that the comparator remains in the high state until the magnitude of the signal falls one additional level. This eliminates oscillation back-and-forth between attenuation levels when the signal level is near a threshold voltage. The implementation of a digital hysteresis circuit is well known in the art and therefore will not be discussed further.

Figure 8A:
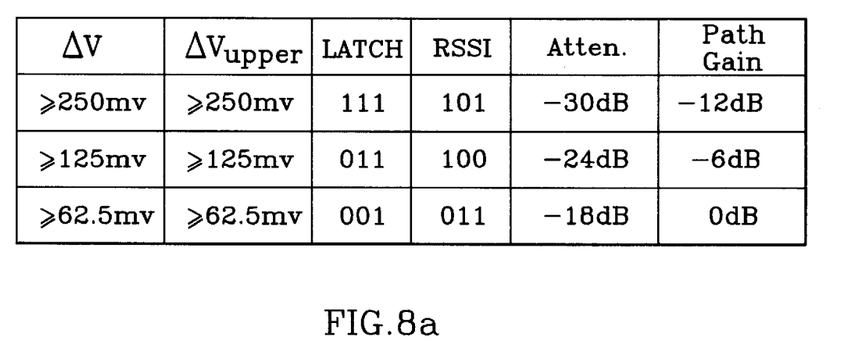
Figure 8B:
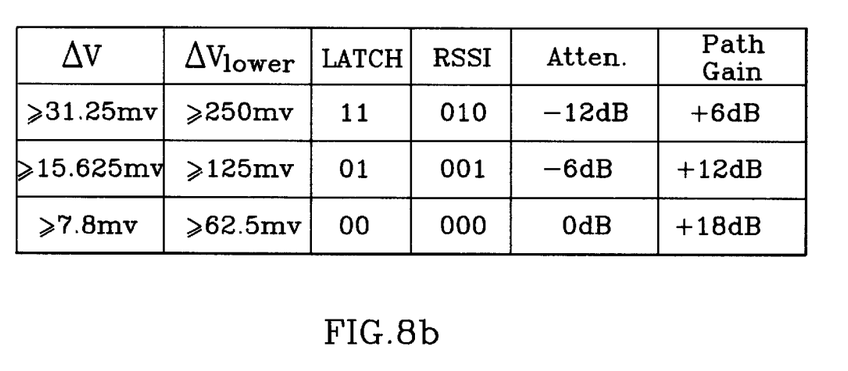

FIGS. 8a and 8b illustrate the operation of the upper and lower peak detectors for the described embodiment where the full-scale input range of the fixed-range ADC is 1v peak-to-peak. The magnitude of the received signal $\Delta V = |V - V_c|$ is provided in column 1. The magnitude of the analog signal at the input to the upper or lower peak detectors is given in column 2. The states of the latches and the corresponding RSSI are shown in columns 3 and 4. The selected attenuation level and total gain of the signal path at the input to the ADC 59 are provided in columns 5 and 6.

As illustrated in FIGS. 8a and 8b, the peak levels and selected attenuation levels are paired such that the magnitude of the attenuated signal applied to the ADC 59 shown in FIGS. 2 and 3 lies between 125 mv and 250 mv or 1/4 to 1/2 the ADC's 0.5V full-scale input range when the received signal is less than one quarter-scale. When the received signal is greater than quarter-scale, the attenuated signal applied to the ADC lies between 125 mv and 500 mv or 1/4 to full-scale. This maintains a minimum of 9 to 10 bits of resolution on a clock-to-clock basis and a full 11 bits when the received signal would otherwise overrange the ADC 59. Below 15.625 mV peak-to-peak, the ADC signal is reduced linearly with reductions in the input signal strength.

Figure 9:
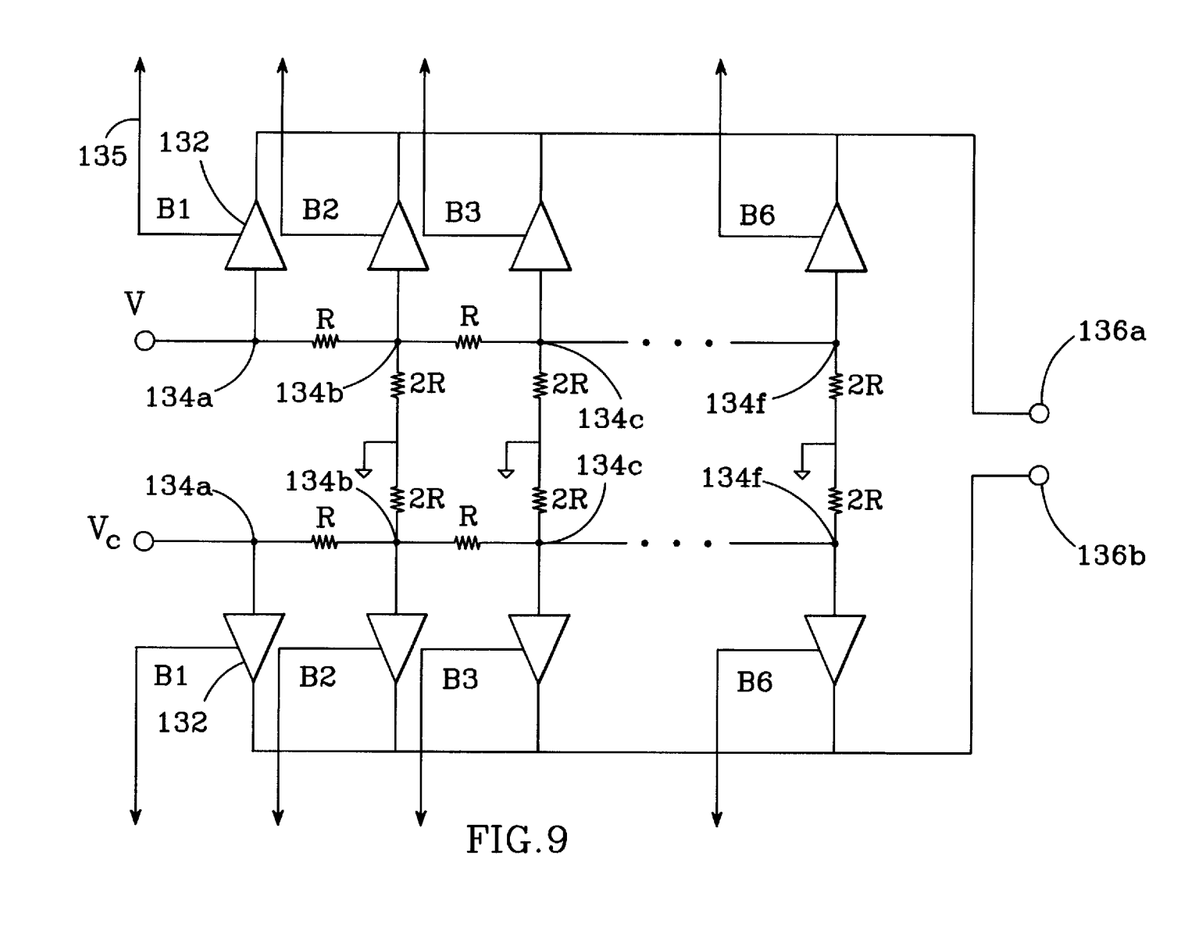
FIG. 9 is a schematic block diagram of a preferred embodiment of the programmable attenuator using digitally controlled buffers shown in FIGS. 2 and 3.
Figure 10:
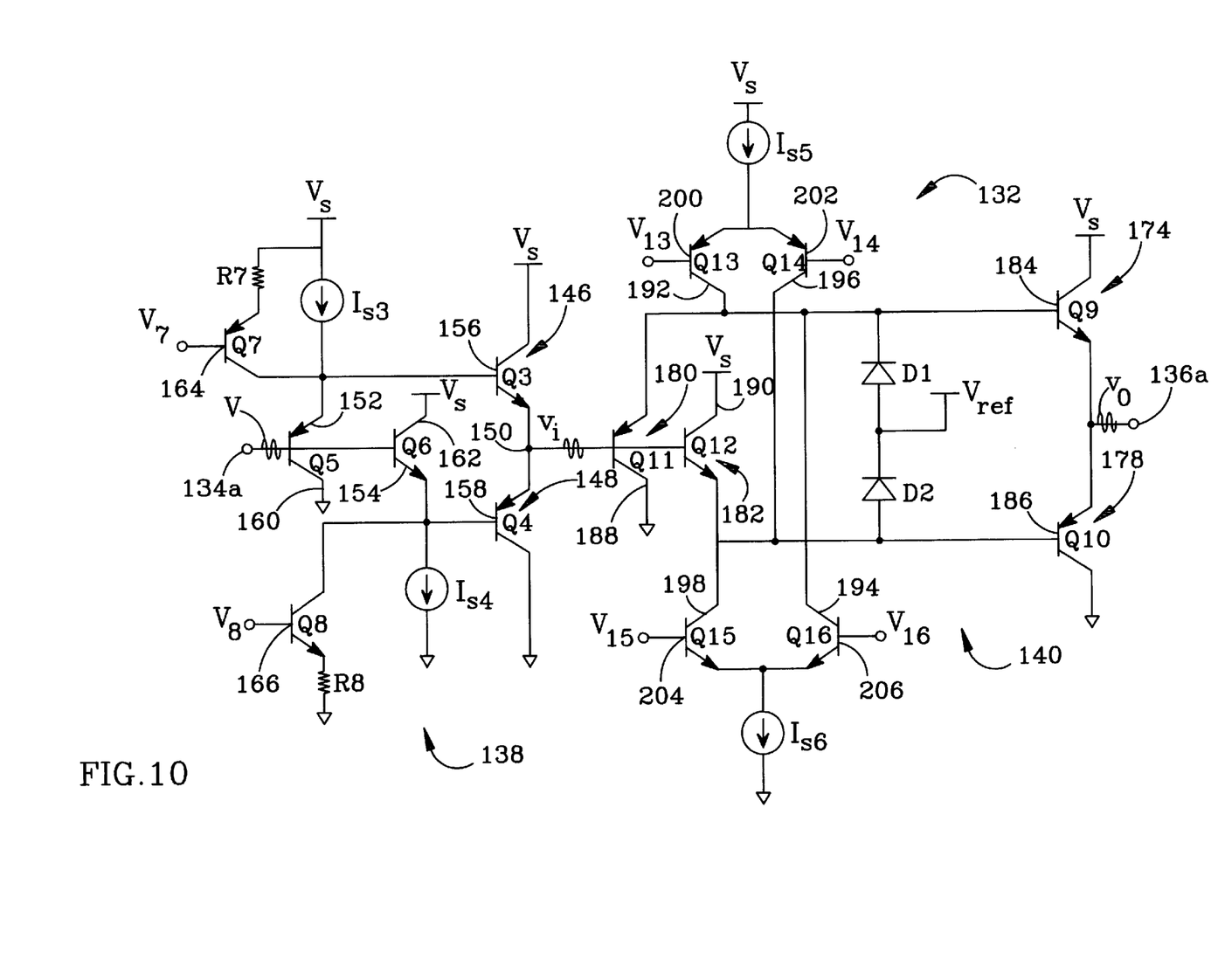
FIG. 10 is a schematic diagram of one of the buffers shown in FIG. 9.

As shown in FIG. 9, a preferred embodiment of the digitally controlled programmable attenuator 55 shown in FIG. 2 includes a multi-tap ladder network 130 that sets the desired tap-to-tap dB step-size for the attenuation levels and a plurality of unity gain digitally switched voltage-to-voltage buffers 132 that are connected between the respective taps 134a, 134b, . . . 134f and a common differential output 136a and 136b. This architecture can be implemented using a complementary bipolar process as shown in FIG. 10 or a BiCMOS process that provide a wide bandwidth and maintain the phase information of the attenuated signal. A standard R-2R ladder configuration with six buffers per side is used to set a −6 dB tap-to-tap drop and attenuation levels of 0, −6, −12, −18, −24 and −30 dB.

The signal's complementary voltage signals V and $V_c$ are applied to the top tap 134a of the multi-tap ladder network 130. The peak detector switches a binary voltage on control lines 135 to turn on one pair of buffers 132 in accordance with a binary code B1,B2,B3,B4,B5 and B6, one on each side of the ladder network 130, so that the attenuated voltage signals V and $V_c$ at their associated taps are switched through to the common differential output 136a and 136b while the other buffers 132 are held off. In the described embodiment, the control circuit selects the reference attenuation level of 0 dB by setting the code to 100000. Once the peak level is detected, the peak detector generates the RSSI and the corresponding binary code to select the attenuation level associated with the detected peak level.

An important feature of the described programmable attenuator is that the input impedance of each buffer 132 is approximately constant, whether turned on or off. Thus, switching between the unity gain buffers does not change the phase of the attenuated signal. Phase matching within 0.2° at frequencies up to 300 MHz for 30 dB of gain range has been realized. Another feature of the programmable attenuator is that the buffer's bias current can be throttled back when its turned off. This reduces the power consumption of the programmable attenuator, and hence the auto-ranging ADC. The complementary bipolar fabrication process provides the speed necessary to operate directly on the IF band.

As shown in FIG. 10, a complementary bipolar implementation of the unity gain buffer 132 includes an input stage 138 that remains on to buffer the voltage signal V through to an output stage 140 with unity gain and presents an approximately constant input impedance at its tap 134a to maintain phase matching between the different attenuation levels. The output stage 140 is switched on and off in response to the binary code Bn to selectively switch the attenuated signal voltage V through to the common output 136a.

The input stage 138 includes a class AB push-pull unity gain buffer that is modified to throttle back the bias current when the buffer 132 is off. The push-pull buffer includes a pair of npn and pnp emitter-follower output transistors Q3 and Q4 whose collector-emitter circuits 146 and 148 are connected in series at node 150 between the positive supply voltage $V_s$ and ground reference potential. The output transistors Q3 and Q4 deliver power on alternate half-cycles of the voltage signal V to produce a voltage signal $v_i$ at node 150.

The base-emitter junctions 152 and 154 of pnp and npn bias transistors Q5 and Q6 are connected between tap 134$a$ and the bases 156 and 158 of output transistors Q3 and Q4, respectively. Transistor Q5's and Q6's collectors 160 and 162 are connected to ground and the positive supply respectively. This shifts the voltage at the base 156 of Q3 up and the voltage at the base 158 of Q4 down by a base-emitter voltage with respect to the voltage signal V thereby substantially eliminating crossover distortion in the voltage signal $v_i$ so that it accurately follows the voltage signal V with unity gain.

Neglecting base currents, the bias current for transistor Q5 is supplied by the parallel combination of a constant current source $I_{S3}$ and a pnp transistor Q7 with a collector resistor R7. Similarly, the bias current for transistor Q6 is supplied by the parallel combination of a constant current source $I_{S4}$ and an npn transistor Q8 with a collector resistor R8. When the buffer 132 is on (B1=1), the digital voltage signals $V_7$ and $V_8$ at the bases 164 and 166 of transistors Q7 and Q8 are switched low and high, respectively, so that both transistors are forward biased and supply bias current. The total bias current for Q5 and Q6 is suitably 0.25 ma to 0.5 ma with approximately one-half of that being supplied by transistors Q7 and Q8.

When the buffer 132 is off (B1=0), transistors Q7 and Q8 are reverse biased, and thus do not supply current. This throttles the bias current through transistors Q5 and Q6 back by about one-half, which reduces power consumption. Although the reduced bias current is not sufficient to sustain the performance of the input stage were the buffer on, it is sufficiently large that transistors Q5 and Q6 remain on. As a result, the buffer's input impedance, which is primarily composed of the parasitic collector-base capacitance of transistor Q5, is insensitive to the changes in bias current. If the bias current were throttled back to the point that transistors Q5 and Q6 were turned off, the input impedance would change and induce a phase mismatch between different attenuated signals.

The output stage 140 includes a class AB push-pull unity gain buffer and a digitally controlled switching circuit that turns the unity gain buffer on and off in response to binary signal B1. The unity gain buffer includes a pair of npn and pnp emitter-follower output transistors Q9 and Q10 whose collector-emitter circuits 174 and 178 are connected in series between the positive supply voltage $V_S$ and ground reference potential to produce a voltage signal $v_o$ at the common differential output 136$a$ that follows the voltage signal $v_i$, and hence voltage signal V. The base-emitter junctions 180 and 182 of pnp and npn bias transistors Q11 and Q12 are connected between node 150 and the bases 184 and 186 of output transistors Q9 and Q10, respectively. Transistor Q11's and Q12's collectors 188 and 190 are connected to ground and the positive supply respectively. This shifts the voltage at the base 184 of Q9 up and the voltage at the base 186 of Q10 down by a base-emitter voltage with respect to the voltage signal $v_i$.

The switching circuit includes a pair of emitter-coupled pnp transistors Q13 and Q14 and a pair of emitter-coupled npn transistors Q15 and Q16. The collectors 192 and 194 of transistors Q13 and Q16, respectively, are connected to the emitter of transistor Q11. The collectors 196 and 198 of transistors Q14 and Q15, respectively, are connected to the emitter of transistor Q12. Current sources $I_{S5}$ and $I_{S6}$ supply the bias current to the respective pnp and npn transistor pairs. A pair of diodes D1 and D2 are connected in series between the bases of output transistors Q9 and Q10 with the voltage at the series connection of the diodes being held at a reference voltage $V_{ref}$ of approximately 2.4V. Binary control voltage signals $V_{13}$, $V_{14}$, $V_{15}$ and $V_{16}$ are applied to the bases 200, 202, 204 and 206 of transistors Q13, Q14, Q15 and Q16, respectively, and switch in accordance with the value of B1.

When control voltage signals $V_{13}$ and $V_{16}$ are low and $V_{14}$ and $V_{15}$ are high (B1=1), the bias current flows through bias transistors Q11 and Q12, which turns the output transistors Q9 and Q10 on and turns the diodes D1 and D2 off. As a result, the voltage signal $v_o$ is switched through to the differential output 136$a$. When control voltage signals $V_{13}$ and $V_{16}$ are high and $V_{14}$ and $V_{15}$ are low (B1=0), the bias current bypasses transistors Q11 and Q12, which turns the output transistors Q9 and Q10 off. Turning transistors Q14 and Q16 on, pulls the voltage at the base 184 of Q9 down and pulls the voltage at the base 186 of Q10 up thereby turning diodes D1 and D2 on. This prevents the voltage signal $v_i$ from bleeding through to the common output 136$a$.

While several illustrative embodiments of the invention have been shown and described, numerous variations and alternate embodiments will occur to those skilled in the art. For example, the main and diversity signals can be different baseband signals or they can be the same signal with different input gain levels. Such variations and alternate embodiments are contemplated, and can be made without departing from the spirit and scope of the invention as defined in the appended claims.

We claim:

1. A clock-to-clock auto-ranging analog-to-digital converter (ADC), comprising:

a timing circuit that generates an internal clock signal at a sampling frequency;

an input for receiving an analog signal of sufficiently high frequency that at least one half of a period of said analog signal occurs during a detection portion of each cycle of the clock signal;

a programmable attenuator that attenuates the analog signal at a reference attenuation level during said detection portion and at a selected attenuation level during a remaining hold portion of the clock cycle;

a fixed-range ADC that samples the attenuated analog signal at said sampling frequency over a full-scale input range such that the attenuated analog signal during the hold portion is aliased into a frequency region between DC and one half the sampling frequency and that converts the samples into a digital signal; and a peak detector that detects a peak level during said detection portion of each cycle, resets the selected attenuation level based upon said peak level such that the amplitude of the attenuated analog signal presented to the fixed-range ADC is within its full-scale input range prior to the next sampling period, and outputs a codeword that represents the selected attenuation level.

2. The auto-ranging ADC of claim 1, wherein the analog signal lies in an intermediate frequency (IF) band which extends from approximately twice the sampling frequency to approximately 250 MHz.

3. The auto-ranging ADC of claim 1, wherein the peak detector sets the reference attenuation level during the leading portion of a first half-cycle of each successive cycle to detect the peak level, resets the attenuation level at the end of said leading portion so that the attenuated signal settles prior to the onset of a second half-cycle, at which the fixed-range ADC tracks the attenuated signal and, at the onset of the next first half-cycle, holds and then converts the attenuated signal into the digital signal while the peak detector detects the peak level for the next sampling period.

4. The auto-ranging ADC of claim 1, wherein said programmable attenuator and said peak detector respectively attenuate the analog signal and detect its peak level at respective pluralities of attenuation and peak levels, said peak detector responding to the detected peak level by resetting the programmable attenuator to the corresponding attenuation level.

5. The auto-ranging ADC of claim 4, wherein the successive peak levels and the successive attenuation levels are each separated by approximately 6 dB of gain and set so that the attenuated signal's amplitude lies between one-quarter and one-half of the ADC's full-scale input range.

6. The auto-ranging ADC of claim 5, wherein the attenuated signal's amplitude lies between one-quarter and the full-scale input range when the maximum peak level is detected.

7. The auto-ranging ADC of claim 4, wherein said peak detector comprises:
a plurality of peak detection stages for detecting peak levels of the analog signal over different portions of the full-scale input range, each said peak detection stage having a lower RC time constant than would a single peak detector designed to detect all of the peak levels so that said peak detection stages have a bandwidth that spans the frequency of the analog signal.

8. The auto-ranging ADC of claim 7, wherein said plurality of peak detection stages includes upper and lower stages for detecting peak levels that lie in a sub-scale input range, said programmable attenuator's reference attenuation level attenuating said analog signal so that an upper portion of the full-scale range is matched to the upper peak detection stage's sub-scale input range so that it detects peak levels that lie in said upper portion, further comprising:
a fixed gain stage between said upper and lower peak detection stages for amplifying the attenuated signal so that a lower portion of the full-scale range is matched to the lower peak detector's sub-scale input range so that it detects peak levels that lie in said lower portion.

9. The auto-ranging ADC of claim 4, wherein said programmable attenuator comprises:
a multi-tap resistive ladder network that attenuates the analog signal to establish the different attenuation levels at its taps; and
a plurality of digitally switched buffers that are connected between the respective taps and a common output, the one said buffer whose attenuation level corresponds to the peak level being turned on by said codeword so that the attenuated signal at its tap is switched through to the common output while the other buffers are held off.

10. The auto-ranging ADC of claim 9, wherein each digitally switched buffer comprises:
an input stage that is always on such that it presents an approximately constant impedance at its tap so that the total impedance of the programmable attenuator, and thus the phase of the attenuated signal is approximately constant regardless of which buffer is switched on; and
an output stage that turns on and off in response to the codeword to selectively switch the attenuated signal at its tap through to the common output.

11. The auto-ranging ADC of claim 10, wherein said input stage conducts a bias current and comprises:

a current regulation circuit that reduces the bias current to reduce power consumption when the buffer is off.

12. The auto-ranging ADC of claim 11, wherein said analog signal comprises a carrier signal at said sufficiently high frequency and an information signal component in a baseband frequency range, said internal clock signal's sampling frequency satisfying the Nyquist criterion such that the digital signal accurately represents the information signal component.

13. A clock-to-clock auto-ranging dual-channel analog-to-digital converter (ADC), comprising:
a timing circuit that generates an internal clock signal at a sampling frequency;
a pair of signal inputs for receiving main and diversity analog signals of sufficiently high frequency that at least one half of a period of said analog signals occurs during a detection portion of each cycle of the clock signal;
a control input for receiving a control signal that selects a) the main signal, b) the diversity signal, or c) the main and diversity signals on alternating clock cycles;
a pair of programmable attenuators that, when selected, attenuate the main and diversity analog signals, respectively, at a reference attenuation level during said detection portion and at a selected attenuation level during a remaining hold portion of the clock cycle;
a fixed-range ADC that samples the selected attenuated analog signal at said sampling frequency over a full-scale input range such that the selected attenuated analog signal during the hold portion is aliased into a frequency region between DC and one half the sampling frequency and that converts the samples into a digital signal; and
a peak detector that detects a peak level of the selected analog signal during said detection portion of each cycle, resets the selected attenuator's attenuation level based upon said peak level such that the amplitude of the attenuated analog signal presented to the fixed-range ADC is within its full-scale input range prior to the next sampling period, and outputs a codeword that represents the selected attenuation level.

14. The auto-ranging ADC of claim 13, wherein the main and diversity signals lie in an intermediate frequency (IF) band which extends from approximately 70 MHz to approximately 250 MHz.

15. The auto-ranging ADC of claim 13, wherein the peak detector sets the reference attenuation level during the leading portion of a first half-cycle of each successive cycle to detect the peak level, resets the attenuation level at the end of said leading portion so that the analog signal settles prior to the onset of a second half-cycle, at which the fixed-range ADC tracks the analog signal and, at the onset of the next first half-cycle, holds and then converts the analog signal into the digital signal while the peak detector detects the peak level for the next sampling period.

16. The auto-ranging ADC of claim 13, wherein said programmable attenuator and said peak detector respectively attenuate the analog signal and detect its peak level at respective pluralities of attenuation and peak levels, said peak detector responding to the detected peak level by resetting the programmable attenuator to the corresponding attenuation level.

17. The auto-ranging ADC of claim 16, wherein the successive peak levels and the successive attenuation levels are each separated by approximately 6 dB of gain and set so that the attenuated analog signal lies between one-quarter and one-half of the ADC's full-scale input range.

18. The auto-ranging ADC of claim 17, wherein the attenuated analog signal lies between one-quarter and the full-scale input range when the maximum peak level is detected.

19. An intermediate frequency (IF) receiver, comprising:
   a main antenna for receiving a radio frequency (RF) carrier signal that is modulated with a plurality of baseband information signals such that they lie in different intermediate frequency (IF) bands in different RF channels, said baseband information signals having a dynamic range;
   a main RF filter for selecting an RF channel from the RF carrier signal;
   a local oscillator for downconverting the selected RF channel to select an IF band;
   a main IF filter for selecting a modulated carrier signal from the IF band that is modulated with one of the baseband information signals, the modulated carrier signal's power envelope varying over a wide dynamic range;
   an auto-ranging analog-to-digital converter (ADC) that converts the modulated carrier signal into a digital signal that represents the selected baseband information signal, said ADC comprising:
      a timing circuit that generates an internal clock signal at a sampling frequency that is sufficiently low that at least one half of a period of the modulated carrier signal occurs during a detection portion of each cycle of the clock signal and sufficiently high that it satisfies the Nyquist sampling criterion for the baseband information signal;
   a main programmable attenuator that attenuates the modulated carrier signal at a reference attenuation level during said detection portion and at a selected attenuation level during a remaining hold portion of the clock cycle;
   a fixed-range ADC that samples the attenuated carrier signal at said sampling frequency over a full-scale input range such that the attenuated analog signal during the hold portion is aliased into a frequency region between DC and one half the sampling frequency and that converts the samples into a digital signal that accurately represents the baseband information signal;
   a peak detector that detects a peak level during said detection portion of each cycle, resets the selected attenuation level based upon said peak level such that the amplitude of the attenuated carrier signal presented to the fixed-range ADC is within its full-scale input range prior to the next sampling period, and outputs a codeword that represents the selected attenuation level; and
   a digital signal processor (DSP) that combines the digital signal and said codeword and extracts the baseband information signal.

20. The IF receiver of claim 19, wherein said DSP includes a single equalizer for equalizing the digital signal for all of the attenuation levels.

21. The auto-ranging ADC of claim 19, wherein said peak detector comprises:
   a plurality of peak detection stages for detecting peak levels of the modulated carrier signal over different portions of the full-scale input range, each said peak detection stage having a lower total resistance than would a single peak detector designed to detect all of the peak levels so that said peak detection stages have a bandwidth that spans the frequency of the modulated carrier signal.

22. The auto-ranging ADC of claim 21, wherein said plurality of peak detectors includes upper and lower peak detectors for detecting peak levels that lie in a sub-scale input range, said programmable attenuator's reference attenuation level attenuating said modulated carrier signal so that an upper portion of the full-scale range is matched to the upper peak detector's sub-scale input range so that it detects peak levels that lie in said upper portion, further comprising:
   a fixed gain stage between said upper and lower peak detectors for amplifying the attenuated signal so that a lower portion of the full-scale range is matched to the lower peak detector's sub-scale input range so that it detects peak levels that lie in said lower portion.

23. The auto-ranging ADC of claim 19, wherein said programmable attenuator comprises:
   a multi-tap resistive ladder network that attenuates the modulated carrier signal to establish the different attenuation levels at its taps; and
   a plurality of digitally switched buffers that are connected between the respective taps and a common output, the one said buffer whose attenuation level corresponds to the peak level turning on so that the attenuated signal at its tap is switched through to the common output while the other buffers are held off.

24. The auto-ranging ADC of claim 23, wherein each digitally switched buffer comprises:
   an input stage that is always on such that it presents an approximately constant impedance at its tap so that the total impedance of the programmable attenuator, and thus the phase of the attenuated signal is approximately constant regardless of which buffer is switched on; and
   an output stage that turns on and off in response to the digital code to selectively switch the attenuated signal at its tap through to the common output.

25. The auto-ranging ADC of claim 24, wherein said input stage conducts a bias current and comprises:
   a current regulation circuit reduces the bias current to reduce power consumption when the buffer is off.

26. A method of converting an analog signal to a digital signal, comprising:
   generating an internal clock signal at a sampling frequency that defines a sampling period;
   receiving an analog signal of sufficiently high frequency that at least one half of a period of said analog signal occurs during a detection portion of each sampling period;
   at the onset of each sampling period, attenuating the analog signal at a reference attenuation level;
   detecting a peak level over at least one half cycle of the attenuated signal;
   selecting an attenuation level for the detected peak level such that the amplitude of the attenuated signal lies within a full-scale conversion range during the remaining portion of the current cycle;
   outputting a codeword that represents the selected attenuation level;
   attenuating the analog signal at the selected attenuation level;
   sampling the attenuated analog signal at said sampling frequency over the full-scale conversion range such that the attenuated analog signal during the hold portion is aliased into a frequency region between DC and one half the sampling frequency; and at the onset of the next sampling period, converting the samples of the attenuated signal into a digital signal.

27. The method of claim 26, wherein the attenuation levels and peak levels are separated by approximately 6 dB of gain, said attenuation levels being selected such that the attenuated signal lies between one-quarter and one-half of the full-scale conversion range.

28. The method of claim 27, wherein when the maximum peak level is detected, said attenuation levels are selected such that the attenuated signal lies between one-quarter and the full-scale conversion range.

29. The method of claim 26, wherein the peak level is detected by:

detecting peak levels that lie in an upper portion of the full-scale conversion range;

amplifying the attenuated signal; and detecting peak levels that lie in a lower portion of the full-scale conversion range.

\* \* \* \* \*